(12) United States Patent
Child

(10) Patent No.: US 8,816,258 B2
(45) Date of Patent: Aug. 26, 2014

(54) SEGMENTED SUSCEPTOR FOR TEMPERATURE UNIFORMITY CORRECTION AND OPTIMIZATION IN AN INDUCTIVE HEATING SYSTEM

(75) Inventor: Kent Riley Child, Dublin, CA (US)

(73) Assignee: Intermolecular, Inc., San Jose, CA (US)

( * ) Notice: Subject to any disclaimer, the term of this patent is extended or adjusted under 35 U.S.C. 154(b) by 343 days.

(21) Appl. No.: 13/314,361

(22) Filed: Dec. 8, 2011

(65) Prior Publication Data

US 2013/0146588 A1 Jun. 13, 2013

(51) Int. Cl.
*H05B 6/10* (2006.01)
*H05B 6/64* (2006.01)

(52) U.S. Cl.
USPC .......................................... 219/634; 219/759

(58) Field of Classification Search
CPC .............. H05B 6/02; H05B 6/00; H05B 6/12; H05B 6/10; H05B 6/80; H05B 6/64
USPC ......... 219/600, 618, 622, 620, 624, 633, 730, 219/759, 642, 634, 635, 725, 728; 426/107, 426/108, 234
See application file for complete search history.

(56) References Cited

U.S. PATENT DOCUMENTS

| | | | | |
|---|---|---|---|---|
| 5,019,681 A | * | 5/1991 | Lorence et al. | 219/759 |
| 5,059,279 A | * | 10/1991 | Wilson | 216/100 |
| 6,133,560 A | * | 10/2000 | Zeng et al. | 219/730 |
| 6,180,932 B1 | * | 1/2001 | Matsen et al. | 219/615 |
| 6,380,525 B2 | * | 4/2002 | Dalton | 219/759 |
| 6,608,291 B1 | * | 8/2003 | Collins et al. | 219/662 |
| 6,897,419 B1 | * | 5/2005 | Brown et al. | 219/634 |
| 2008/0035632 A1 | * | 2/2008 | Fujita et al. | 219/634 |
| 2010/0270289 A1 | * | 10/2010 | Lasko | 219/634 |

* cited by examiner

*Primary Examiner* — Tu B Hoang
*Assistant Examiner* — Michael LaFlame, Jr.

(57) ABSTRACT

An inductively coupled heating system having a segmented susceptor is disclosed. The segmented susceptor includes two or more segments, each segment having a side edge that is mateable with a side edge of another segment. The two mated side edges form an interface, increasing eddy currents near the interface. An inductively coupled heating system having a susceptor with multiple doped regions is also disclosed.

14 Claims, 6 Drawing Sheets

SEGMENTED SUSCEPTOR FOR TEMPERATURE UNIFORMITY CORRECTION AND OPTIMIZATION IN AN INDUCTIVE HEATING SYSTEM

TECHNICAL FIELD

The present disclosure relates generally to semiconductor manufacturing and in particular to improved susceptors for an inductive heating system.

BACKGROUND

Induction heating is the process of heating an electrically conducting object (usually a metal) by electromagnetic induction, where eddy currents (also called Foucault currents) are generated within the metal and resistance leads to Joule heating of the metal. An induction heater includes an electromagnet through which a high-frequency alternating current (AC) is passed (i.e., an inductive coil coupled to a susceptor), to generate eddy currents in the metal (i.e., the susceptor). The frequency of AC used in induction heating depends on the object size, material type, coupling (between the work coil and the object to be heated) and the penetration depth. Heat may also be generated by magnetic hysteresis losses in materials that have significant relative permeability.

An exemplary prior art susceptor is shown in FIG. 1. As shown in FIG. 1, the prior art susceptors 100 are made of a single piece of material. Induction heating has limitations as to temperature uniformity due to induction coil pattern being superimposed in the susceptor and because the nature of induction heating is to heat edge to center. The heating at the edges first is an effect of larger eddy currents being at the side boundaries first and then radiating inward. In general, the temperature at the center is at least more than 20° C. lower than the edge.

Prior art attempts to address non-uniform heating in inductive heating systems have focused on changes to coil densities, coil shape, position of coil to susceptor. These coil design changes are very time consuming, expensive and space constraining.

Another problem with prior art susceptors is that the susceptor material is fragile and the susceptor is costly. If the susceptor is heated too quickly or the surface is damaged in any way, the susceptor material cracks and breaks. Whenever any part of the susceptor is cracked or warped, the whole susceptor is destroyed and must be replaced.

Accordingly, new developments and improvements are needed.

SUMMARY

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

According to one aspect of the invention, an inductive heating system is disclosed that includes a susceptor comprising a plurality of susceptor segments, each susceptor segment comprising at least one edge mateable with at least one edge of at least one other susceptor segment; and an induction coil inductively coupled to the susceptor.

A portion of the at least one edge of each susceptor segment may mate with a portion of the at least one edge of at least one other susceptor segment. Eddy currents are induced at each interface, and throughout the segmented material formed by the mating of the edges of the susceptor segments.

In some embodiments the induction coil is a pancake coil. The induction coil is selected from the group consisting of a conical coil, a circular coil, and a pancake coil. The plurality of susceptor segments may include two or more susceptor segments. The susceptor may further include a support, the plurality of susceptor segments positioned in the support.

The plurality of susceptor segments may be graphite coated with silicon carbide. Is some embodiments, the distance between the susceptor and the induction coil may be variable. Each of the plurality of susceptor segments may be removable.

At least one of the plurality of susceptor segments may be positioned at a height that is higher than a height of at least one other of the plurality of susceptor segments. The susceptor may have a conical topography. The susceptor may have a curved topography.

According to another aspect of the invention, a susceptor for an inductive heating system is disclosed that includes a first susceptor piece comprising a first side edge; and a second susceptor piece comprising a second side edge, wherein at least a portion the first side edge mates with at least a portion of the second side edge.

In some embodiments, the first side edge may mate with the second side edge. The susceptor may further include third susceptor piece having a third side edge, and wherein the first susceptor piece comprises a fourth side edge, wherein at least a substantial portion the third side edge may mate with at least a substantial portion of the fourth side edge.

The susceptor may further include a support, the first susceptor piece and the second susceptor piece positioned in the support. The height of the first susceptor piece may be different than the height of a second susceptor piece.

According to a further aspect of the invention, a susceptor for an inductive heating system is disclosed that includes a first susceptor region having a first doping profile; and a second susceptor region having a second doping profile, wherein the first doping profile is different than the second doping profile. The first susceptor region may be more conductive than the second susceptor region. The first susceptor region may be doped with a first metal, and the second susceptor region may be doped with a second metal, the first metal being different than the second metal. The susceptor may further include a third susceptor region having a third doping profile, wherein the third doping profile is different than the first doping profile and the second doping profile.

BRIEF DESCRIPTION OF THE DRAWINGS

The accompanying drawings, which are incorporated into and constitute a part of this specification, illustrate one or more examples of embodiments and, together with the description of example embodiments, serve to explain the principles and implementations of the embodiments.

DETAILED DESCRIPTION

Figure 1:
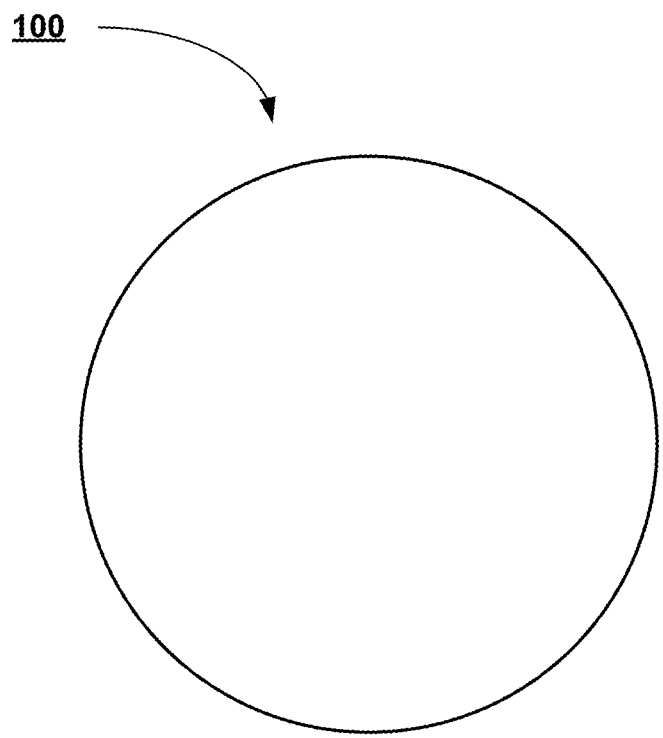
FIG. 1 is a schematic diagram of a prior art susceptor plate.

Embodiments of the invention are directed to an inductively coupled heating system having a segmented susceptor. The segmented susceptor includes two or more segments, each segment having a side edge that is mateable with a side edge of another segment. The two mated side edges form an interface, which causes eddy currents to be doubled relative to a prior art susceptor, which is made of a single piece of material. A segmented susceptor is advantageous because it improves uniformity of heating of a substrate resulting from the eddy currents. The segmented susceptor is also advantageous because individual segments that are damaged can be replaced, as opposed to the entire susceptor.

Embodiments of the invention are also directed to an inductively coupled heating system having a susceptor with multiple doped regions. A doping agent is selectively introduced into two or more regions of a susceptor. Each region is more or less reactive to induced currents than the other regions. The multiple doped regions are advantageous because the susceptor has a flatter heat profile and greater temperature uniformity.

The manufacture of semiconductor devices entails the integration and sequencing of many unit processing steps. As an example, semiconductor manufacturing typically includes a series of processing steps such as cleaning, surface preparation, deposition, patterning, etching, thermal annealing, and other related unit processing steps. The precise sequencing and integration of the unit processing steps enables the formation of functional devices meeting desired performance metrics such as efficiency, power production, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as semiconductor devices. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009, the entireties of which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005, the entireties of which are all herein incorporated by reference.

HPC processing techniques have been successfully adapted to wet chemical processing such as etching, texturing, polishing, cleaning, etc. HPC processing techniques have also been successfully adapted to deposition processes such as sputtering, atomic layer deposition (ALD), and chemical vapor deposition (CVD).

Figure 2:
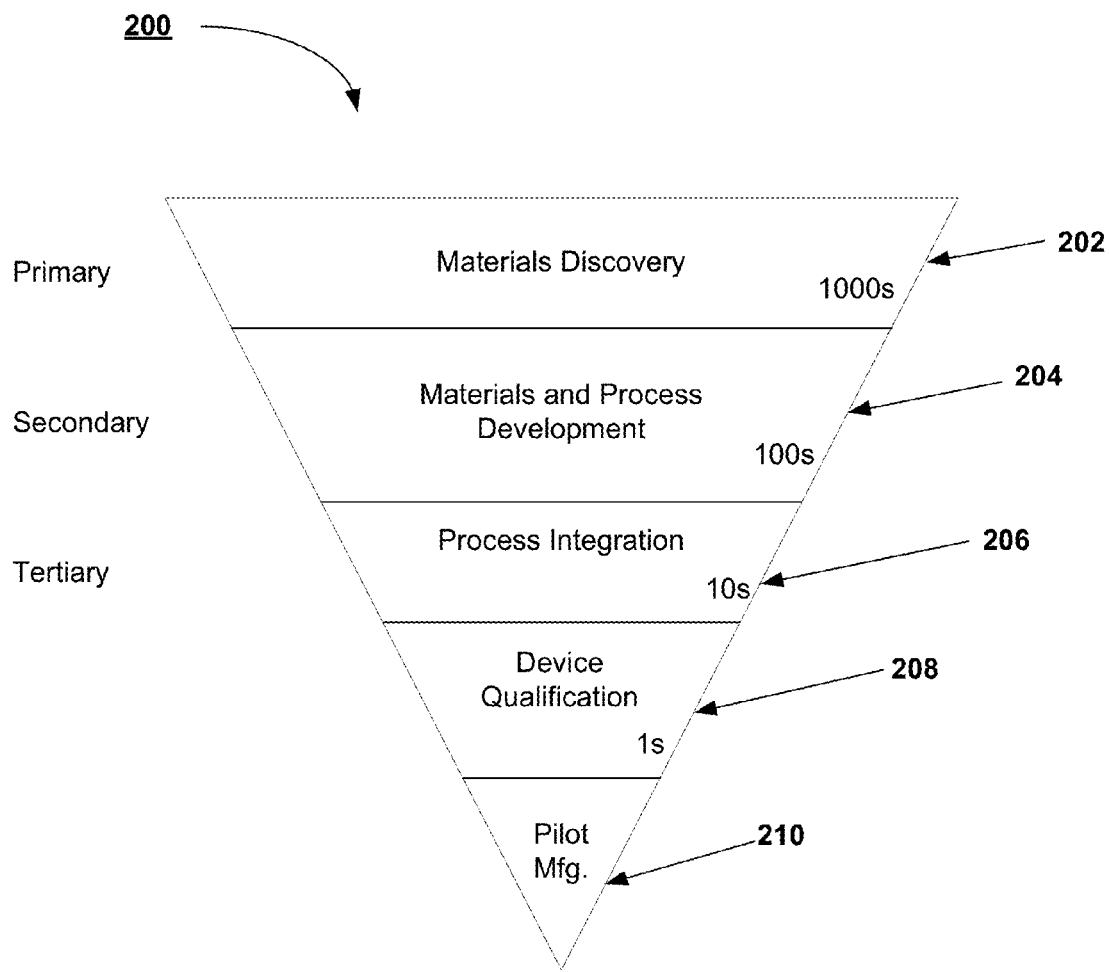
FIG. 2 is a schematic diagram for implementing combinatorial processing and evaluation.

FIG. 2 illustrates a schematic diagram, 200, for implementing combinatorial processing and evaluation using primary, secondary, and tertiary screening. The schematic diagram, 200, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 202. Materials discovery stage, 202, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 204. Evaluation of the materials is performed using metrology tools such as electronic testers and imaging tools (i.e., microscopes).

The materials and process development stage, 204, may evaluate hundreds of materials (i.e., a magnitude smaller than the primary stage) and may focus on the processes used to deposit or develop those materials. Promising materials and processes are again selected, and advanced to the tertiary screen or process integration stage, 206, where tens of materials and/or processes and combinations are evaluated. The tertiary screen or process integration stage, 206, may focus on integrating the selected processes and materials with other processes and materials.

The most promising materials and processes from the tertiary screen are advanced to device qualification, 208. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 210.

The schematic diagram, 200, is an example of various techniques that may be used to evaluate and select materials and processes for the development of new materials and processes. The descriptions of primary, secondary, etc. screening and the various stages, 202-210, are arbitrary and the stages may overlap, occur out of sequence, be described and be performed in many other ways.

Figure 3:
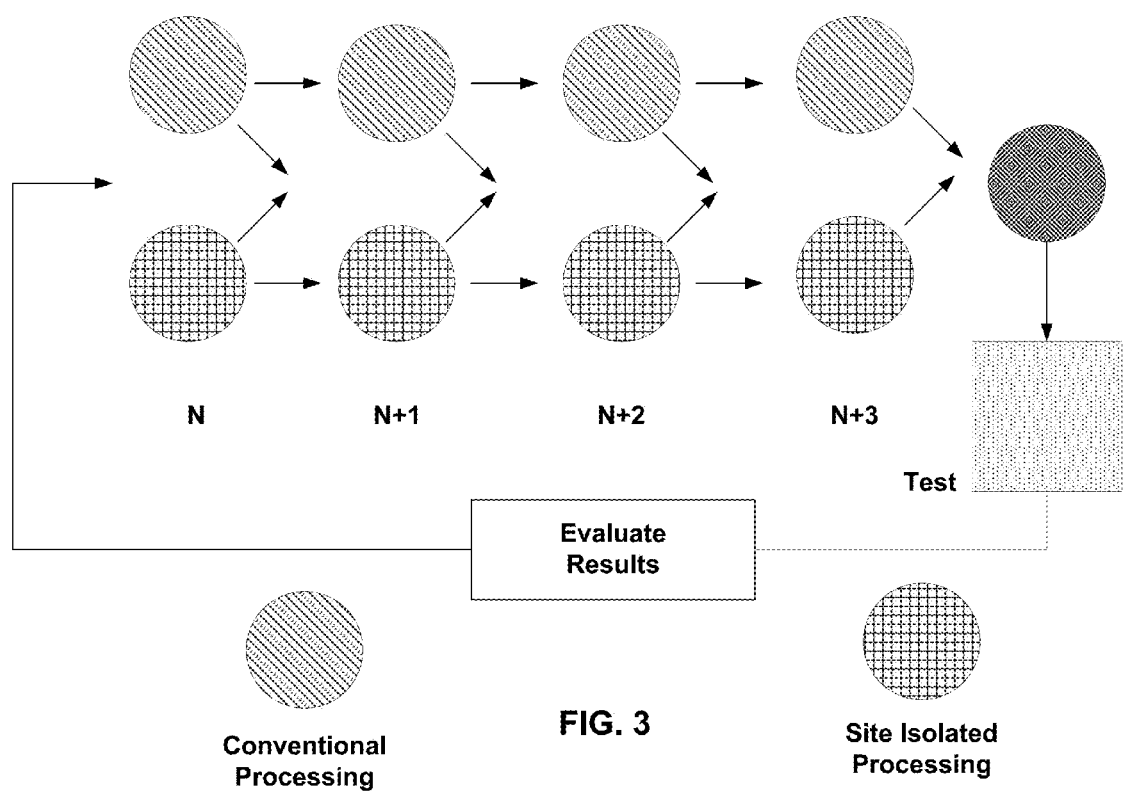
FIG. 3 is a schematic diagram for illustrating various process sequences using combinatorial processing and evaluation.

FIG. 3 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 3. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in semiconductor manufacturing may be varied.

Figure 4:
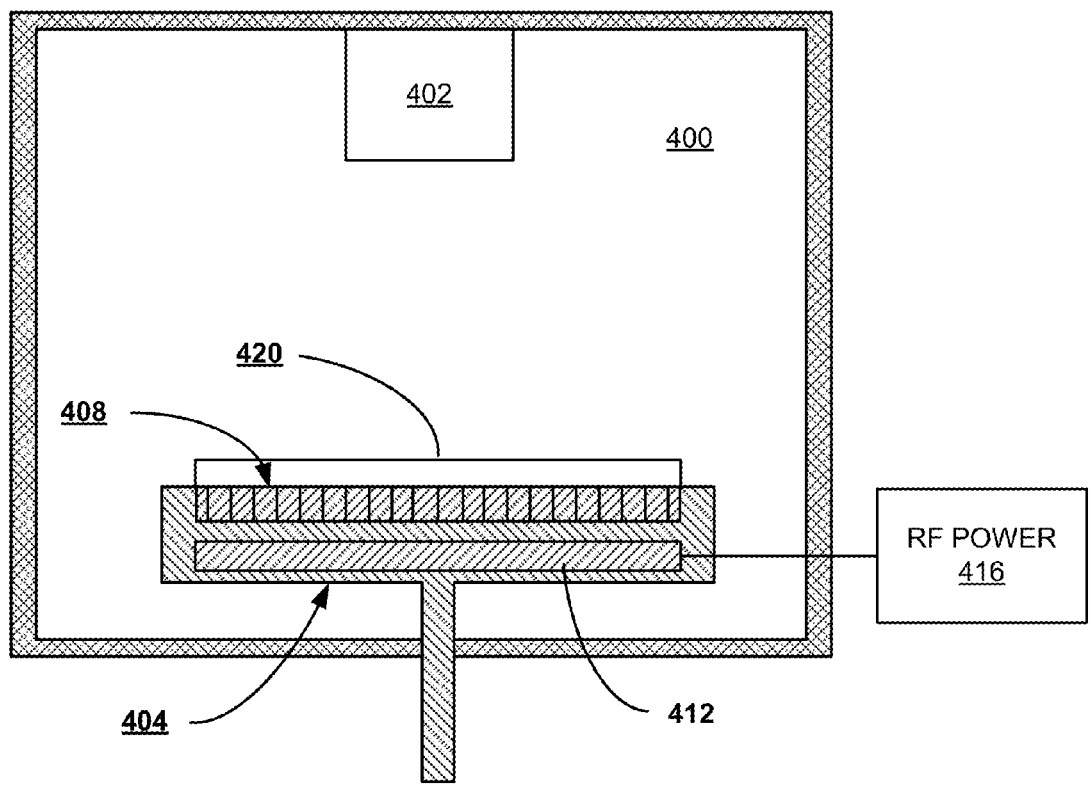
FIG. 4 is a schematic diagram of a process chamber having an inductive heating system according to one embodiment of the invention.

FIG. 4 is a simplified diagram illustrating an exemplary process chamber 400 of a substrate processing system that can be used for conventional or combinatorial processing. The process chamber may be any type of chamber used in semiconductor processing, such as, for example, a plasma etching reactor, a reactive ion etching (RIE) reactor, a chemical vapor deposition (CVD) reactor, a plasma enhanced CVD (PECVD) reactor, a physical vapor deposition (PVD) reactor, an electron cyclotron resonance (ECR) reactor, a rapid thermal processing (RTP) reactor, an ion implantation system, and the like. The process chamber 400 typically includes a source 402 for performing one of the above processes.

The process chamber 400 also typically includes a substrate support 404. The substrate support 404 illustrated in FIG. 4 includes an induction heating system, which includes a susceptor 408, an induction coil 412 and a RF power source 416, to heat a substrate (or wafer) 420 that is positioned on the substrate support 404. The susceptor 408 has improved temperature uniformity compared to prior art susceptors as described above with reference to FIG. 1. Additional details regarding the susceptor 408 will be described below with reference to FIGS. 5-7.

The induction coil 412 may be any type of induction coil, including, for example, a conical coil, a circular coil, a pancake coil, and the like, and in one particular embodiment, the induction coil 412 is a pancake coil. The induction coil 412 may be positioned below the susceptor 408 such that the coil 412 and susceptor 408 are separated by a distance. In some embodiments, the distance between the susceptor 408 and the coil 412 is variable. As described above, the induction coil 412 generates electromagnetic energy that causes eddy currents in the susceptor 408, resulting in heating of the substrate 420. The substrate 416 may be heated up to 3000° C. or higher depending on the power applied to the coil.

Radio frequency (RF) power is applied to the induction coil 412 via the RF power source 416 to generate the electromagnetic energy. In some embodiments, the RF power is variable, but the RF power is typically low frequency power.

Figure 5:
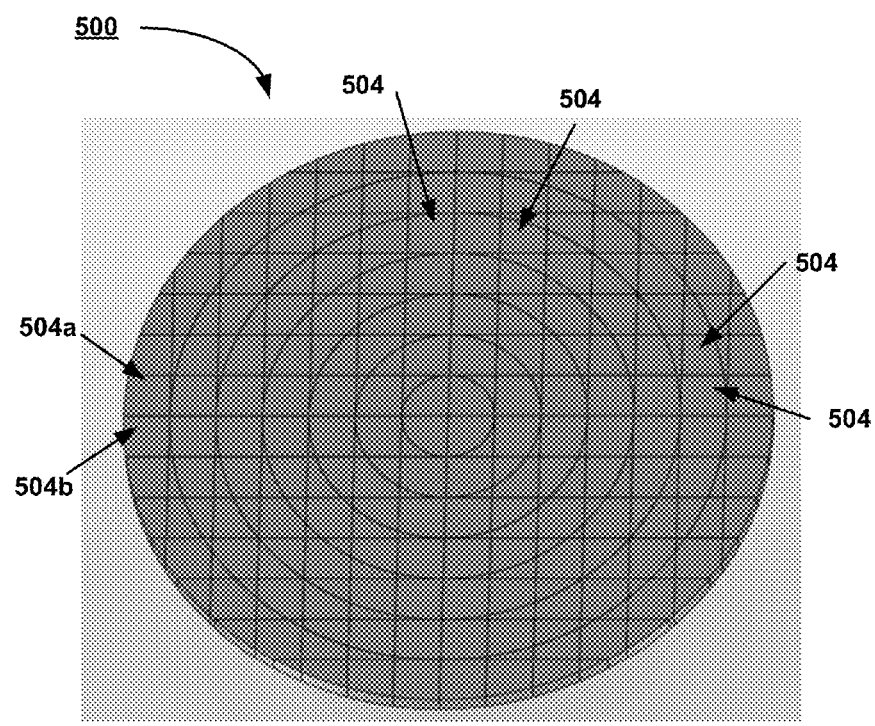
FIG. 5 is a perspective view of a segmented susceptor for an inductive heating system according to one embodiment of the invention.

FIG. 5 illustrates a segmented susceptor 500 in accordance with some embodiments of the invention. In one embodiment, the segmented susceptor 500 shown in FIG. 5 is the susceptor 408 in the induction heating system shown in FIG. 4.

As shown in FIG. 5, the susceptor 500 is segmented into multiple discrete segments 504. In FIG. 5, the susceptor 500 is segmented into more than one hundred discrete segments 504. It will be appreciated, however, that the susceptor may be segmented into any number of segments 504, including any value or range of values between about two segments and thousands of segments. The susceptor segments 504 may be made of any conductive material used as a susceptor material, as known to those skilled in the art, and, in one particular embodiment, the susceptor segments 504 are made of graphite coated with silicon carbide.

In some embodiments, the segments 504 are formed by cutting a pattern into a whole susceptor using a laser cutter. It will be appreciated that various patterns may be used to form the segments 504, and that other methods may be used to cut the susceptor into the segments 504.

Figure 5A:
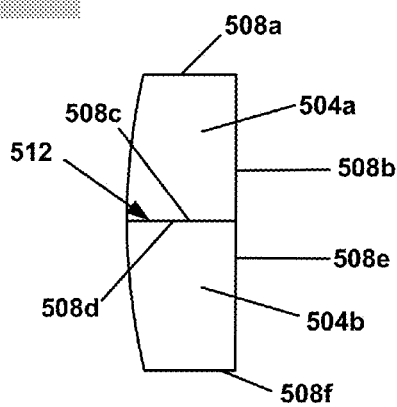
FIG. 5A is a detailed schematic view of two exemplary segments of the segmented susceptor of FIG. 5 according to one embodiment of the invention.

FIG. 5A is a simplified, detailed view illustrating two exemplary adjacent segments 504*a* and 504*b*. As shown in FIG. 5A, each segment 504 includes multiple edges 508. For example, segment 504*a* includes mateable edges 508*a*-*c*, and segment 504*b* includes mateable edges 508*d*-*f*. In FIG. 5A, edge 508*c* of segment 504*a* and edge 508*d* of adjacent segment 504b mate to form a mated side interface 512. Although FIG. 5A illustrates complete mating of edges 508c and 508d, the inventive affect may be achieved so long as a substantial portion of the edges are mated (e.g., at least 75% mating).

During operation, eddy currents are generated at each of the mated side interfaces 512, in the susceptor 500, thereby increasing the eddy currents that are generated in the susceptor 500 as a whole. Because eddy currents are generated at each interface 512, each segment 504 is heated individually, resulting in a more uniform heating of the susceptor 500. As explained above, the number of segments may be between two and thousands of segments. It will be appreciated, however, that smaller segments (i.e., a greater the number of segments) produce better temperature uniformity because there will be more interfaces 512.

The segmented susceptor 500 is also advantageous over prior art susceptors because it has a significant cost benefit. If a segment 504 is damaged, the one damaged segment 504 can be removed and replaced with a new segment. In contrast, if a prior art susceptor is damaged, the entire susceptor must be replaced.

Figure 6:
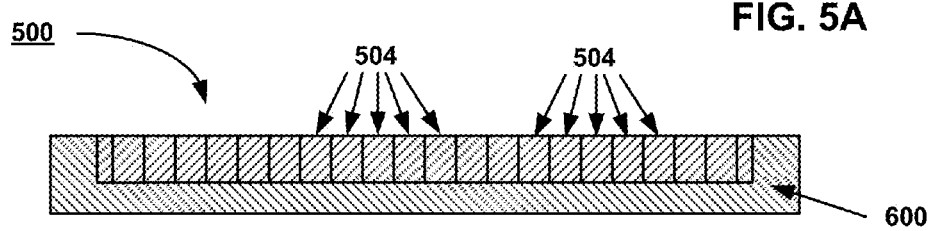
FIG. 6 is a cross-sectional view of a substrate support including a segmented susceptor according to one embodiment of the invention.

FIG. 6 is a detailed cross-sectional view showing the susceptor 500 positioned in a susceptor holder 600. In one embodiment, the susceptor holder 600, which contains all of the susceptor segments 504, is positioned in the substrate support 404. The susceptor holder 600 is configured to support the susceptor segments 504 in the correct pattern so that the segments 504 form mating interfaces 512 with adjacent segments 504. In one embodiment, the susceptor holder 600 is a ceramic holder, and, in one particular embodiment, the support 600 is a quartz plate.

As shown in FIG. 6, the susceptor segments 504 are positioned so that the susceptor 500 has a generally flat topography. However, one or more of the susceptor segments may positioned in the support 600 so that the height of the susceptor segment(s) is higher than other susceptor segments. For example, the susceptor segments 504 may be positioned in the support 600 so that the susceptor 500 has a conical topography or a curved topography. A non-flat topography can be advantageous because the substrate or wafer can be uniformly heated in cases where there are different stresses on the wafer (e.g., high-density vs. low-density). In addition, the topography can be modified so that different quadrants or regions of the susceptor can have different temperature ranges for testing purposes. Thus, the segmented susceptor 500 can be used for heat tuning. In other words, the segmented susceptor 500 can advantageously be used in combinatorial processing, as described above with reference to FIGS. 2 and 3, to test different temperatures (i.e., a processing condition) in various semiconductor processing steps.

Figure 7:
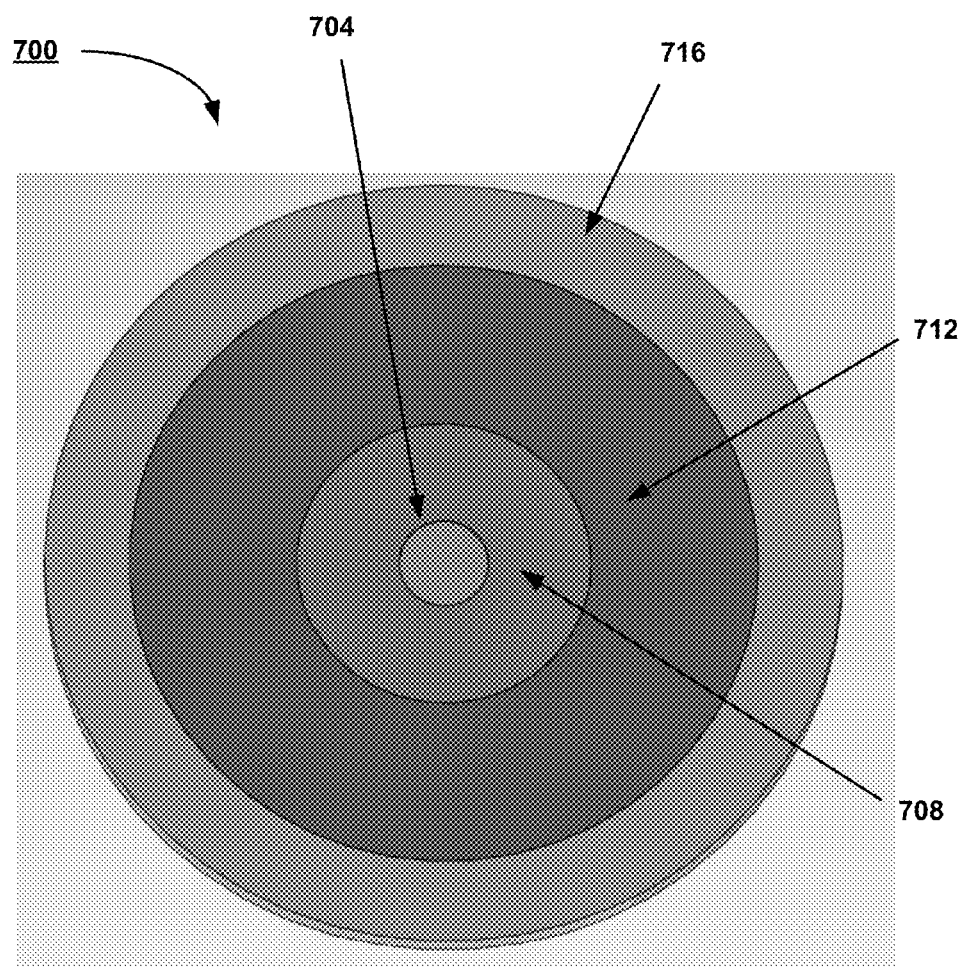
FIG. 7 is a perspective view of a susceptor having multiple doped regions according to one embodiment of the invention.

FIG. 7 illustrates a susceptor 700 in accordance with some embodiments of the invention. In some embodiments, the segmented susceptor 700 shown in FIG. 7 is the susceptor 408 in the induction heating system shown in FIG. 4.

The susceptor 700 includes multiple regions 704, 708, 712 and 716. Although FIG. 7 illustrates a susceptor 700 having four different regions, it will be appreciated that the number of regions may be any value or range of values between about two regions and about twenty regions. It will also be appreciated that the susceptor 700 may have more than twenty regions. Although the regions 704-716 are illustrated as being defined by concentric circles, it will be that the regions may be defined by gridlines (e.g., four quadrants).

Each region 704-716 has a different doping profile than each other region. A doping agent can be introduced selectively into each region 704-716 to make each region 704-716 more or less reactive to induced currents.

In some embodiments, the susceptor region 716 has a doping profile that is more conductive than susceptor region 712, which has a doping profile that is more conductive than susceptor region 708, which is, in turn more conductive than susceptor region 704. It will be appreciated that in alternative embodiments, the susceptor region 704 may be more conductive than susceptor region 708, which is more conductive than susceptor region 712, which is, in turn, more conductive than susceptor region 716. In yet another alternative region, susceptor regions 708 and 712 may be more conductive than susceptor regions 704 and 716.

In some embodiments, the susceptor 700 is made of a single base material, each region 704-716 having a different doping. In one particular embodiment, each region 704-716 has different concentrations of that same metal. For example, Titanium, Tungsten, or any other high temperature metal, and combinations thereof may be used. Alternatively, the regions 704-716 may use different metals or combinations of metals to achieve the different doping profiles. For example, Titanium, Tungsten, or any other high temperature metallic, and combinations thereof may be used.

Eddy currents are generated in each region 704-716 because each region is more or less reactive to induced currents. The susceptor 700 is advantageous because it has a flatter heat profile and greater temperature uniformity.

The invention has been described in relation to particular examples, which are intended in all respects to be illustrative rather than restrictive. Various aspects and/or components of the described embodiments may be used singly or in any combination. It is intended that the specification and examples be considered as exemplary only, with a true scope and spirit of the invention being indicated by the claims.

What is claimed is:

1. An inductive heating system comprising:
    a susceptor comprising a plurality of susceptor segments, each susceptor segment comprising at least one edge configured to be mechanically coupled with at least one edge of at least one other susceptor segment and each susceptor segment having at least a doping region;
    wherein at least two of the plurality of susceptor segments are doped in said doping regions with different doping metals, each doping region defined by a different doping profile;
    wherein each doping region is doped with a metal having a different concentration from other doping regions such that the doping profile of the at least two susceptor segments vary;
    wherein said metal is selected from titanium, tungsten, or combinations thereof; and
    an induction coil inductively coupled to the susceptor.

2. The system of claim 1, wherein eddy currents are induced at each interface formed by the coupling of the edges of the susceptor segments.

3. The system of claim 1, wherein the induction coil is selected from the group consisting of: a conical coil, a circular coil, and a pancake coil.

4. The system of claim 3, wherein the induction coil is a pancake coil.

5. The system of claim 1, wherein the plurality of susceptor segments comprises two susceptor segments.

6. The system of claim 1, wherein the susceptor further comprises a support, the plurality of susceptor segments positioned in the support.

7. The system of claim 1, wherein the plurality of susceptor segments comprise graphite coated with silicon carbide.

8. The system of claim 1, wherein a distance between the susceptor and the induction coil is variable.

9. The system of claim 1, wherein each of the plurality of susceptor segments is removable.

10. The system of claim 1, wherein at least one of the plurality of susceptor segments is positioned at a height that is higher than a height of at least one other of the plurality of susceptor segments.

11. The system of claim 1, wherein the susceptor has a conical topography.

12. The system of claim 1, wherein the susceptor has a curved topography.

13. The system of claim 1, wherein the doping region in the first susceptor segment is more conductive than the doping region in the second susceptor segment.

14. The system of claim 1, further comprising a doping region in a third susceptor segment having a third doping profile, wherein the third doping profile is different than the doping profiles in the first and second susceptor segments.

* * * * *